(12) United States Patent
Xianyu et al.

(10) Patent No.: US 7,566,364 B2
(45) Date of Patent: Jul. 28, 2009

(54) METHOD OF FABRICATING ORIENTATION-CONTROLLED SINGLE-CRYSTALLINE WIRE AND METHOD OF FABRICATING TRANSISTOR HAVING THE SAME

(75) Inventors: Wenxu Xianyu, Suwon-si (KR); Young-Soo Park, Suwon-si (KR); Takashi Noguchi, Yongin-si (KR); Hans S. Cho, Seoul (KR); Xiaoxin Zhang, Yongin-si (KR); Huaxiang Yin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 390 days.

(21) Appl. No.: 11/483,586

(22) Filed: Jul. 11, 2006

(65) Prior Publication Data

US 2007/0017439 A1    Jan. 25, 2007

(30) Foreign Application Priority Data

Jul. 12, 2005    (KR) ...................... 10-2005-0062923

(51) Int. Cl.
*C30B 25/04*    (2006.01)
(52) U.S. Cl. .............................. 117/84; 117/90; 117/91; 117/94; 117/95
(58) Field of Classification Search .................... 117/84, 117/90, 91, 94, 95
See application file for complete search history.

(56) References Cited

U.S. PATENT DOCUMENTS

| | | | |
|---|---|---|---|
| 6,914,256 B2 * | 7/2005 | Zhang et al. .................. 257/15 |
| 2003/0215865 A1 * | 11/2003 | Mayer et al. .................... 435/6 |
| 2004/0144985 A1 * | 7/2004 | Zhang et al. .................. 257/79 |
| 2005/0156180 A1 * | 7/2005 | Zhang et al. .................. 257/79 |
| 2005/0276743 A1 * | 12/2005 | Lacombe et al. ......... 423/447.3 |
| 2007/0113779 A1 * | 5/2007 | Wong et al. .................... 117/84 |

OTHER PUBLICATIONS

"50 nm Vertical Replacement-Gate (VRG) pMOSFETs". Sang-Hyun Oh et al. Bell Laboratories, IEEE, pp. 3.6.1-3.6.4, 2000.

(Continued)

*Primary Examiner*—Robert M Kunemund
(74) *Attorney, Agent, or Firm*—Harness, Dickey & Pierce, P.L.C.

(57) ABSTRACT

Provided may be a method of fabricating nanowires and a method of fabricating a transistor having the same. The method may include: forming a template layer on a substrate, the template layer having a first lateral surface and a second lateral surface facing the first surface; forming pores in the template layer, the pores disposed between the first lateral surface and the second lateral surface in the template layer and having first apertures in the first lateral surface; forming a single-crystalline material layer contacting the first apertures disposed in the first lateral surface of the template layer; forming second apertures connecting pores disposed in the second lateral surface; supplying gaseous crystal growth materials through the second apertures; and forming crystalline nanowires in the pores by crystal growth from the single-crystalline material layer. The nanowires may be made of crystalline materials, e.g., Si or SiGe, and may be formed parallel to the substrate. Higher quality nanowires, whose orientation may be controlled, may be formed. A higher quality transistor may be formed on the substrate by applying a method of fabricating the nanowires.

19 Claims, 7 Drawing Sheets

OTHER PUBLICATIONS

"Room-Temperature Transistor Based On a Single Carbon Nanotube". Sander J. Tans et al. Nature, vol. 393, pp. 49-52, May 7, 1998.

"Mobility Enhancement in Strained Si NMOSFETS with $HfO_2$ Gate Dielectrics". K. Rim et al. IBM T.J. Watson Research Center, IEEE, pp. 12-13, 2002.

"Statistical Model for Stress-Induced Leakage Current and Pre-Breakdown Current Jumps in Ultra-Thin Oxide Layers". R. Degraeve et al. IEEE, pp. 6.2.1-6.2.4, 2001.

"Electric-Field-Directed Growth of Aligned Single-Walled Carbon Nanotubes". Yuegang Zhang et al. Applied Physics Letters, vol. 79, No. 19, Nov. 5, 2001.

"FinFET—A Self-Aligned Double-Gate MOSFET Scalable to 20 nm". Digh Hisamoto et al. IEEE Transactions on Electron Devices, vol. 47, No. 12, pp. 2320-2325, Dec. 2000.

"Highly Ordered Monocrystalline Silver Nanowire Arrays". G. Sauer et al. Journal of Applied Physics, vol. 91, No. 5, pp. 3243-3247, Mar. 1, 2002.

"Fully Depleted Dual-Gated Thin-Film SOI P-MOSFET's Fabricated in SOI Islands with an Isolated Buried Polysilicon Backgate". Jack P. Denton et al. IEEE Electron Device Letters, vol. 17, No. 11, pp. 509-511, Nov. 1996.

"Preparation and Lithium Insertion Properties of Mesoporous Vanadium Oxide". Ping Liu et al. Advanced Materials, 14, No. 1, Jan. 4, 2002.

* cited by examiner

METHOD OF FABRICATING ORIENTATION-CONTROLLED SINGLE-CRYSTALLINE WIRE AND METHOD OF FABRICATING TRANSISTOR HAVING THE SAME

PRIORITY STATEMENT

This application claims priority under 35 USC §119 to Korean Patent Application No. 10-2005-0062923, filed on Jul. 12, 2005, in the Korean Intellectual Property Office (KIPO), the entire contents of which are incorporated herein by reference.

BACKGROUND

1. Field

Example embodiments of the present invention relate to a method of fabricating a single-crystalline wire, for example, a method of fabricating a higher quality single-crystalline wire in which the uniformity and size of the diameter are easily controlled, and a method of fabricating a transistor having the same.

2. Description of the Related Art

The continuous downscaling of conventional CMOS semiconductor devices has been limited by the rapid increase of the integration level thereof. In order to provide highly-integrated devices having higher-performance and lower power consumption in downscaling conventional CMOS semiconductor devices, the widths and lengths of gate electrodes may be reduced, the isolation regions between unit elements may be reduced, and the thicknesses and junction depths of gate insulation layers may be thinned. Because these changes should essentially ensure gate controllability, the ratio of an on-current to an off-current ($I_{on}/I_{off}$) in transistors may be increased. In the conventional art, in order to enhance a driving current, ultra-thin body fully depleted (UTB-FD) silicon-on-insulator (SOI) transistors using SOI substrates and band-engineered transistors which use strained silicon channels to enhance electron mobility and/or the like, have been explored. In addition, various 3-dimensional silicon transistors, for example, vertical transistors, Fin-FETs, and double-gate transistors, have been researched. However, the gate structure of silicon transistors, having 3-dimensional gate structures, may not increase the field effects of the gate. Because a channel should be formed as a silicon substrate or a silicon layer with a 3-dimensional structure determined by deposition and patterning processes, the processes for forming a 3-dimensional gate structure may become complicated.

Recently, as an approach to overcome the downscaling limitation of a silicon device, transistors, using carbon nanotubes (CNTs) as channels, have been developed, for example, a CNT transistor operated at room temperature, a technique of horizontally growing CNTs and/or techniques of vertically growing CNTs from nanoholes.

SUMMARY

Example embodiments of the present invention may provide a method of fabricating a horizontal single crystalline nanowire, which may provide improved gate controllability and fabrication, and a method of fabricating a transistor having the same.

According to an example embodiment of the present invention, there may be provided a method of fabricating a crystalline wire, including: forming a template layer on a substrate, the template layer having a first lateral surface and a second lateral surface facing the first surface; forming pores in the template layer, the pores being disposed between the first lateral surface and the second lateral surface in the template layer and having first apertures in the first lateral surface; forming a single-crystalline material layer contacting the first apertures disposed on the first lateral surface of the template layer; and forming second apertures connecting pores in the second lateral surface, supplying gaseous crystal growth materials through the second apertures, and forming crystalline nanowires in the pores by crystal growth from the single-crystalline material layer.

According to another example embodiment of the present invention, there may be provided a method of fabricating a transistor in which nanowires are used as channels, the method including: forming a template layer on a substrate, the template layer having a first lateral surface and a second lateral surface facing the first surface; forming pores in the template layer, the pores disposed between the first lateral surface and the second lateral surface in the template layer and having first apertures in the first lateral surface; forming a single-crystalline material layer contacting the first apertures disposed on the first lateral surface of the template layer; forming second apertures connecting pores disposed in the second lateral surface, supplying gaseous crystal growth materials through the second apertures, and forming the crystalline nanowires in the pores by crystal growth from the single-crystalline material layer; and forming a gate which forms an electric field toward the crystalline nanowires, and a source and drain electrically connected to ends of the wires.

The crystalline nanowires may be formed of Si, SiGe, and/or the like. The substrate may be formed of Si, sapphire (SiGe), and/or the like.

The forming of the template layer may further include: forming the template layer of aluminum; and forming the pores in the template layer and parallel to the substrate by anodic oxidation.

The method may further include: forming a capping layer on the template layer except for the first lateral surface and the second lateral surface before the forming of the pores.

A buffer layer, made of an insulation material, may be formed on the substrate, and the forming of the single-crystalline material layer may include: forming a window in a portion near the first apertures of the buffer layer, the window exposing the surface of the substrate; and epitaxially growing the single-crystalline material from the surface of the substrate exposed through the window to contact the apertures.

The buffer layer may be formed on the substrate, and the forming of the single-crystalline material layer may include: forming a window in a portion near the first apertures of the buffer layer, the window exposing the surface of the substrate; epitaxially growing the single-crystalline material from the surface of the substrate exposed through the window; forming amorphous silicon on a stacked structure having the first lateral surface of the template layer; and inducing crystallization of the amorphous silicon from the contact portion to the single-crystalline material by annealing, and then transforming the amorphous silicon contacting to the apertures into single-crystalline silicon.

BRIEF DESCRIPTION OF THE DRAWINGS

The above and other features and advantages of example embodiments of the present invention will become more apparent by describing in detail example embodiments thereof with reference to the attached drawings in which.

DETAILED DESCRIPTION OF THE EXAMPLE EMBODIMENTS

Figure 1A:
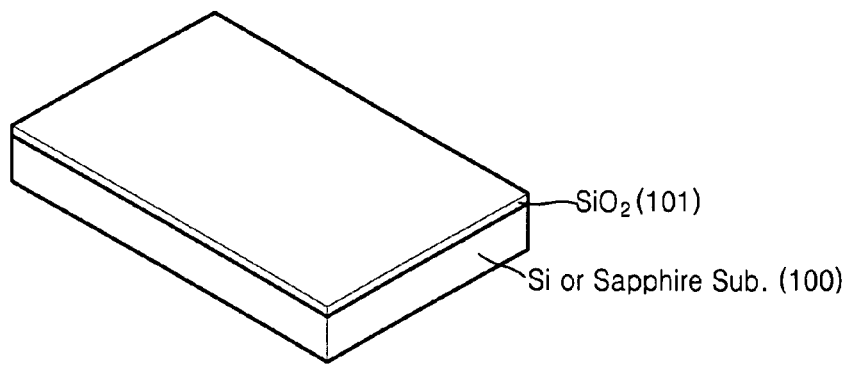
FIGS. 1A-1O sequentially illustrate a method of fabricating a nanowire, according to an example embodiment of the present invention.

Hereinafter, example embodiments of the present invention will be described more fully with reference to the accompanying drawings, in which example embodiments of the invention are shown. A crystalline nanowire of the present invention is formed of a semiconductor material, for example, Si and/or SiGe, however, other crystalline material may be used. Example embodiments of the present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of the example embodiments of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Fabrication of Nanowires

Referring to FIG. 1A, a buffer layer 101 may be formed on a single-crystalline substrate 100 that may be made of silicon, sapphire and/or the like. The buffer layer 101 may be formed of $SiO_2$ and/or the like.

Figure 1B:
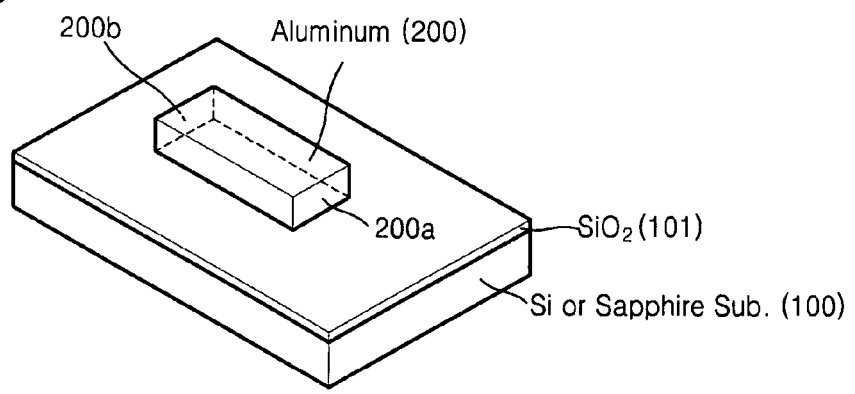

Referring to FIG. 1B, a strip type template layer 200 may be formed on the buffer layer 101. The template layer 200 may include a first lateral surface 200a and a second lateral surface 200b, facing the first lateral surface 200a. The template layer 200 may be made by depositing and/or patterning aluminum. The patterning process may be a conventional wet and/or dry patterning method, for example, a photolithography method and/or the like.

Figure 1C:
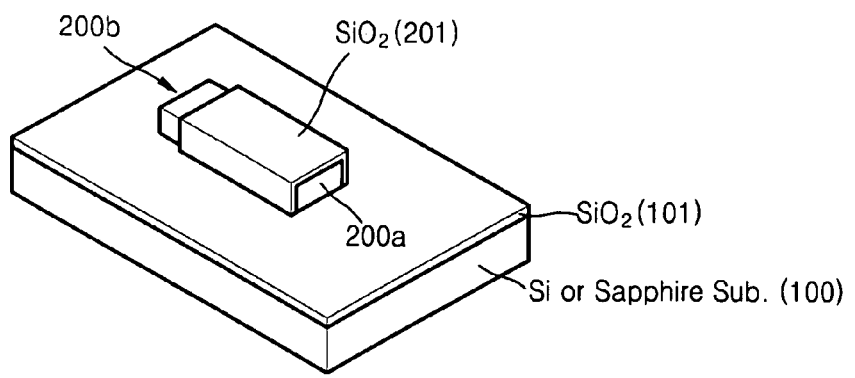

Referring to FIG. 1C, a capping layer 201, made of an insulation material, for example, $SiO_2$ and/or the like, may be formed on the template layer 200. The capping layer 201 may protect the surface of the template layer 200 when anodically oxidizing the template layer 200, and may guide the direction of an electric field on the template layer 200. The first lateral surface 200a and the second lateral surface 200b of the template layer 200 may be exposed. A portion of the template layer 200 near the second lateral surface 200b may be additionally exposed, and a negative voltage may be applied thereto when anodically oxidizing the template layer 200. A positive voltage may be applied to the first lateral surface when anodizing the template layer 200, and thus the anodic oxidization may begin.

Figure 1D:
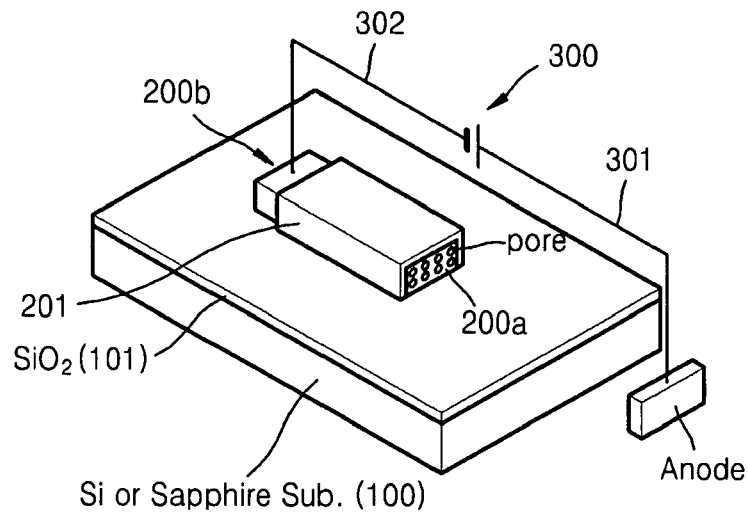

The anodic oxidation of the template layer 200b in an electrochemical bath is illustrated in FIG. 1D. The template layer 200 may be immersed in the electrochemical bath of sulfuric acid ($H_2SO_4$) and/or the like, the first lateral surface 200a of the template layer 200 may face an anode, and then the anodic oxidation may be performed. The anode may be connected to an anode wire 301 of a power source 300 and a portion of the template layer 200, which may be near the second lateral surface 200b, may be connected to a cathode wire 302 of the power source 300. Accordingly, pores 200c may be formed by the anodic oxidation in the first lateral surface 200a of the template layer 200 facing the anode.

Figure 1E:
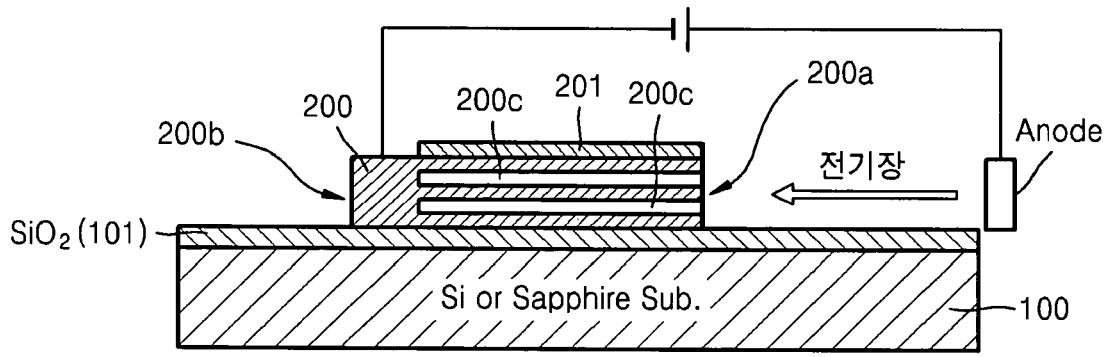

Referring to FIG. 1E, when the anodic oxidation continues for a given period, the pores generated in the first lateral surface 200a of the template layer 200 may extend in a electric field direction, and then, may extend in a longitudinal direction of the template layer 200b. The pores may not be straight in an initial stage, but may become straighter in time. Anodic oxidation may change aluminum to alumina ($Al_2O_3$), and the alumina crystals may grow in the electric field direction such that the pores 200c may be formed at crystal boundaries of the alumina.

In order to obtain uniform pores and the straighter template layer 200 formed by the anodic oxidation, some of the pores having a given length, and initially formed during the anodic oxidation, may be removed, and then an additional anodic oxidation may be performed, thereby obtaining improved pores.

Figure 1F:
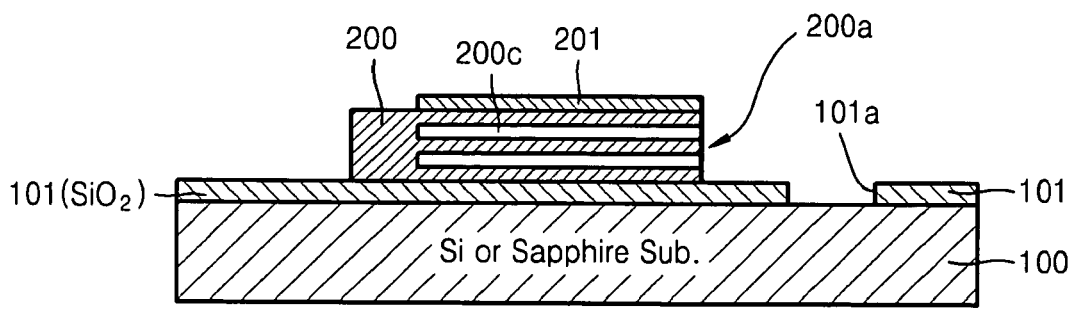
Figure 1G:
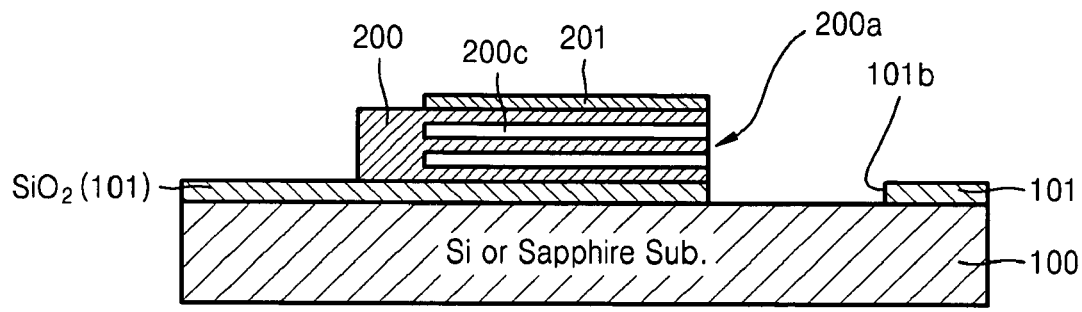

Referring to FIG. 1F, a window 101a exposing a portion of the surface of the substrate 100 near the first lateral surface 200a may be formed on the buffer layer 101. The window 101a may be a given distance from the first lateral surface 200a of the template layer 200. According to another example embodiment of the present invention, the window 101a may be disposed near the first lateral surface 200a, as illustrated in FIG. 1G.

Figure 1H:
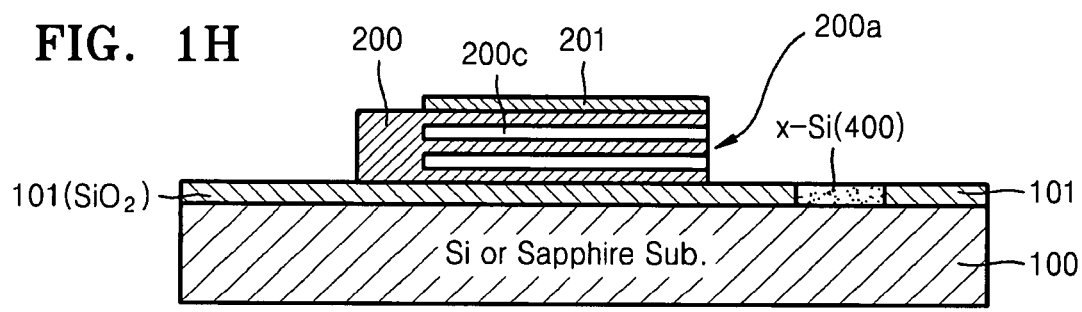
Figure 1I:
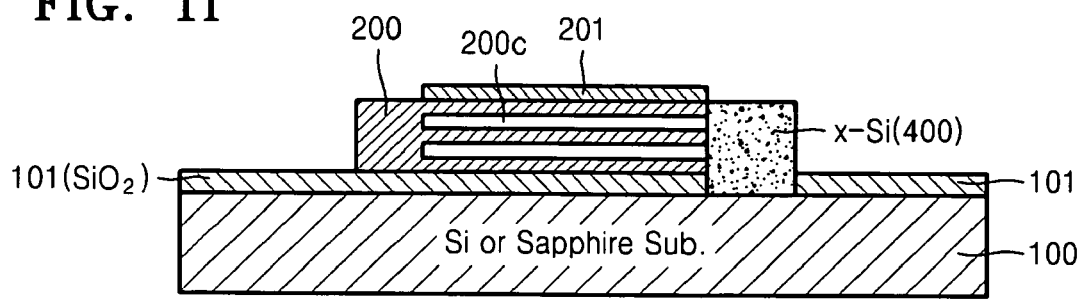

Referring to FIGS. 1H and 1I, a single-crystalline seed layer 400 may be formed on the surface of the substrate 100 exposed through the window 101 a using a commonly known selective epitaxial growth method, e.g., ultra high voltage (UHV) CVD, low pressure (LP) CVD and/or the like. The growing material may be Si, SiGe and/or the like. Referring to FIG. 1H, when the window 101a is a given distance from the template layer 200, a single-crystalline (x-Si) seed layer 400 may be formed in window 101a of the buffer layer 101. Referring to FIG. 1I, when the window 101a is disposed near the first lateral surface 200a of the template layer 200, the single-crystalline (x-Si) seed layer 400 may grow on the surface of the single-crystalline substrate 100 to contact the first lateral surface 200a, e.g., alumina and/or the like, of the template layer 200 such that the first apertures of the pores 200c may be closed by the single-crystalline seed layer 400.

When the single-crystalline seed layer 400 contacts the first lateral surface 200a as shown in FIG. 1I, a process of growing single-crystalline wires inside of the pores 200c may be performed. When the single-crystalline seed layer 400 is disposed apart from the first lateral surface 200a as shown in FIG. 1H, the single-crystalline seed layer 400 may be expanded to the first lateral surface 200a for crystal growth through additional processes, which will be described with respect to FIGS. 1J and 1K.

Figure 1J:
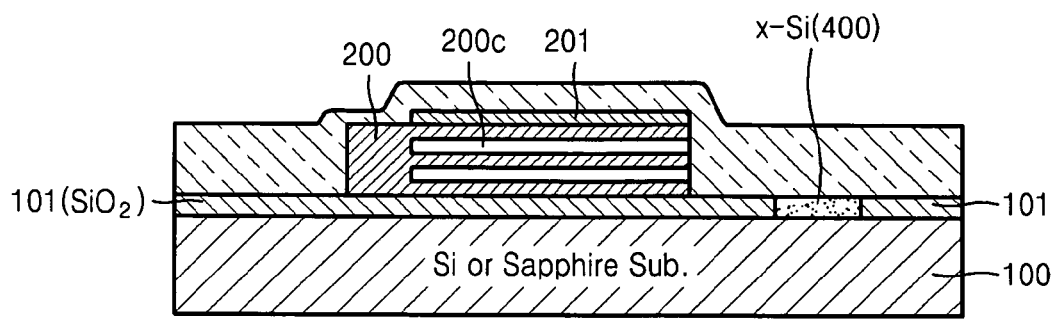

Referring to FIG. 1J, amorphous silicon (a-Si) may be deposited to a given thickness on the stacked structure of the substrate 100 of FIG. 1H using LPCVD and/or the like. The amorphous silicon (a-Si) may physically contact the single-crystalline seed layer 400.

Figure 1K:
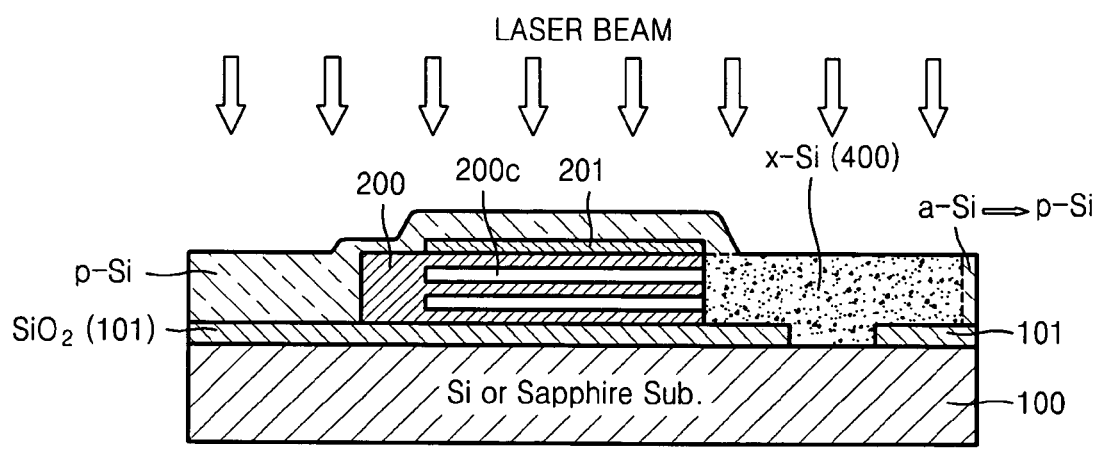

Referring to FIG. 1K, the amorphous silicon (a-Si) may be heat-treated by radiating a laser beam thereon. The amorphous silicon may be crystallized by the heat-treatment to produce single-crystalline silicon (x-Si) from the amorphous silicon contacting the single-crystalline seed layer 400, but silicon which may not be changed into single-crystalline silicon remains as polycrystalline silicon (p-Si). However, if the annealing is sufficiently performed, the single-crystalline silicon may be formed in most regions. However, considering the process efficiency, the crystallization time or the amount of energy may be controlled so that the single-crystalline silicon grown from the single-crystalline seed layer 400 extends to the first lateral surface 200a of the template layer 200.

Figure 1L:
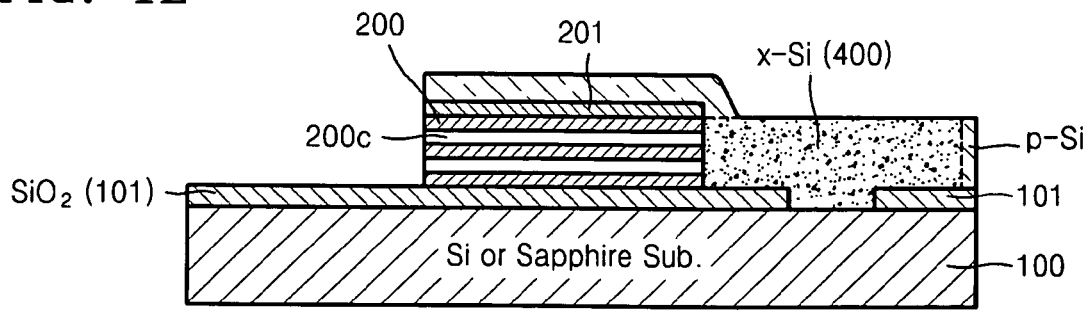
Figure 1M:
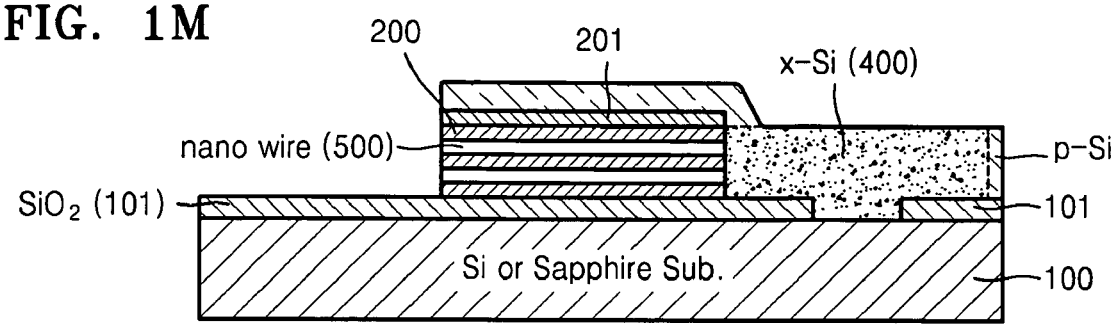

Referring to FIG. 1L, the second lateral surface 200b of the template layer 200 may be removed to a given width, thereby exposing other ends of the inner pores 200c that may be second apertures. The pores 200c may be exposed through second apertures.

to FIG. 1M, single-crystalline nanowires 500 may be formed in the pores 200c grown through UHV CVD, LP CVD and/or the like. The single-crystalline nanowires 500 may grow from the single-crystalline seed layer 400 exposed by the pores 200c through which a source gas passes. The source gas may be a crystal growth gas, and may be Si, SiGe and/or the like.

Figure 1N:
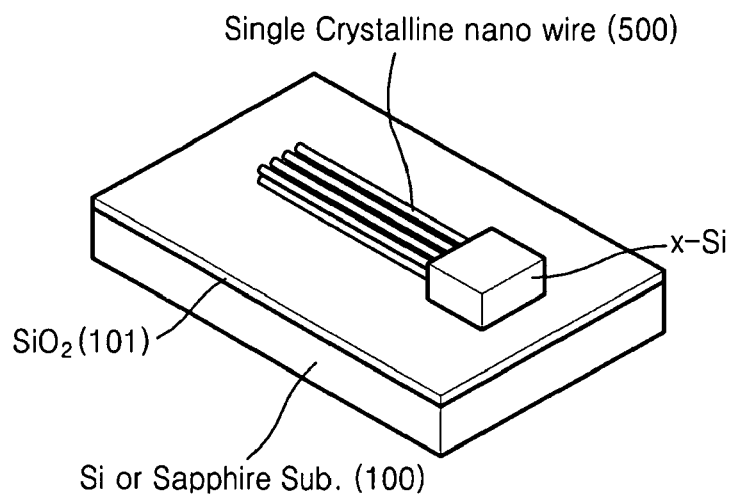

Referring to FIG. 1N, the template layer 200 may be removed, thereby obtaining the single-crystalline nanowires 500. The single-crystalline nanowires 500 may be arranged parallel to one another and may have a form of a simple cantilever and may contact the single-crystalline silicon (x-Si) on the substrate 100.

Figure 1O:
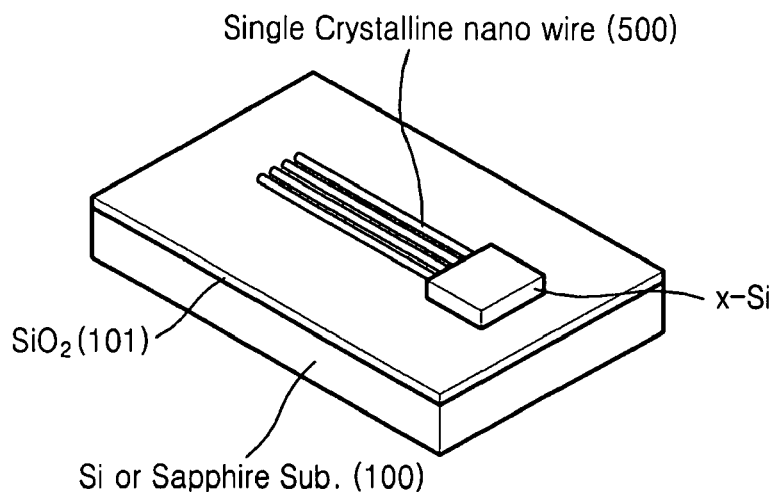

Referring to FIG. 1O, the template layer 200 may be polished by chemical mechanical polishing (CMP) and/or the like such that a single layer of the nanowires may remain, and the template layer 200 may be removed.

A transistor having single-crystalline nanowires as an electron moving channel may be fabricated by changing some of the above-described processes of forming the nanowires and adding other processes.

Hereinafter, a method of fabricating a transistor will be described.

Figure 2A:
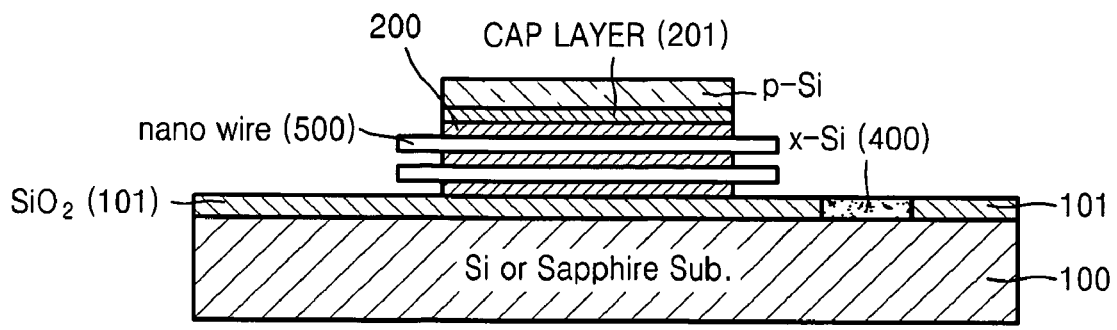
FIGS. 2A-2C illustrate a method of fabricating a transistor having the nanowire illustrated in FIGS. 1A-1O, according to an example embodiment of the present invention.

Referring to FIG. 2A, after the operation of FIG. 1M, nanowires 500 may be formed in the pores 200c of the template layer 200, and then, both ends of the template layer 200 may be selectively removed to a given width, thereby exposing both ends of the nanowires to a given length.

Figure 2B:
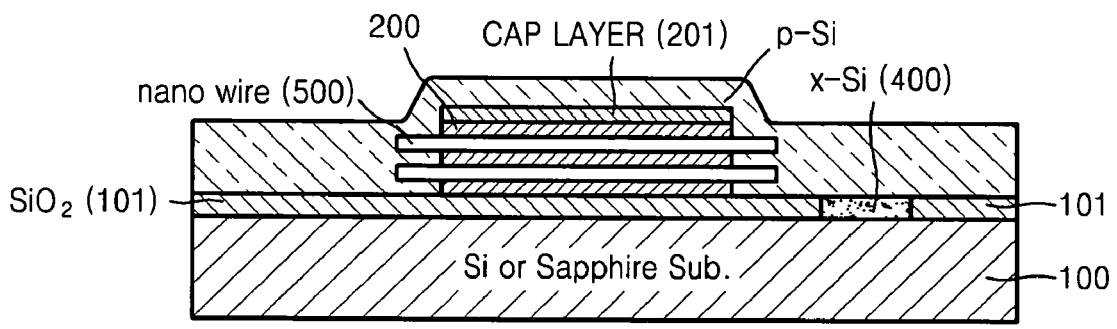

Referring to FIG. 2B, polycrystalline silicon (p-Si) may be deposited to a given thickness on the residual stacked structure of the substrate 100, and then dopants may be implanted into the polycrystalline silicon (p-Si).

Figure 2C:
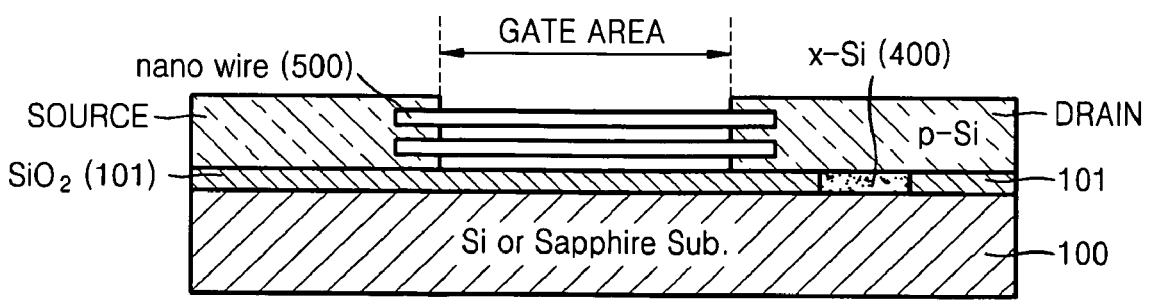

Referring to FIG. 2C, a given width from the polycrystalline silicon (p-Si) to the buffer layer 101 may be etched to remove the template layer 200. The template layer 200 may remain at both ends of the nanowires, but may be completely removed in the present or subsequent processes. The template layer 200 may or may not be completely removed. Doped polycrystalline silicon (doped p-Si), in which both ends of the nanowires may be fixed by portions where the template layer 200 is removed, may be used as a source or a drain. The space between the source and the drain may be a gate region. Gate insulation may form an electric field on the nanowires and a gate may be formed in the entire or local region of the gate region. As described above, the space between the source and the drain may be etched and the source and the drain may be patterned to have a given pattern. The residual polycrystalline silicon protruding from the upper portion of both ends of the nanowires as illustrated in FIG. 2C may also be removed, thereby planarizing the entire structure.

Figure 3A:
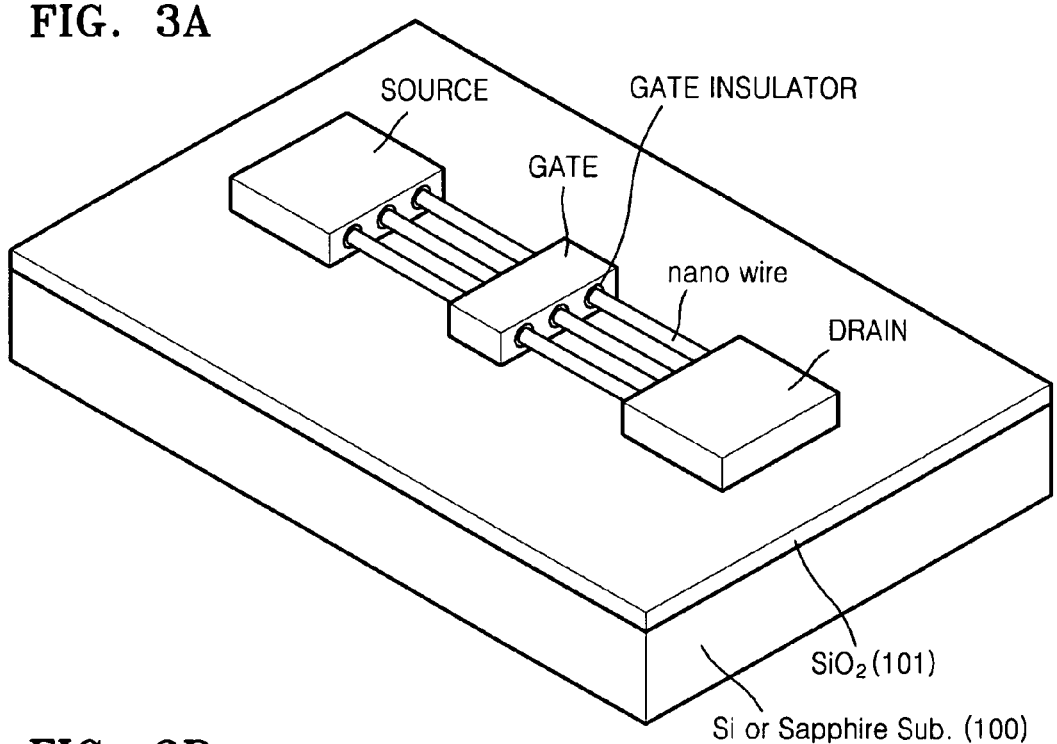
FIGS. 3A and 3B are transistors fabricated by the method of FIG. 2, according to an example embodiment of the present invention.
Figure 3B:
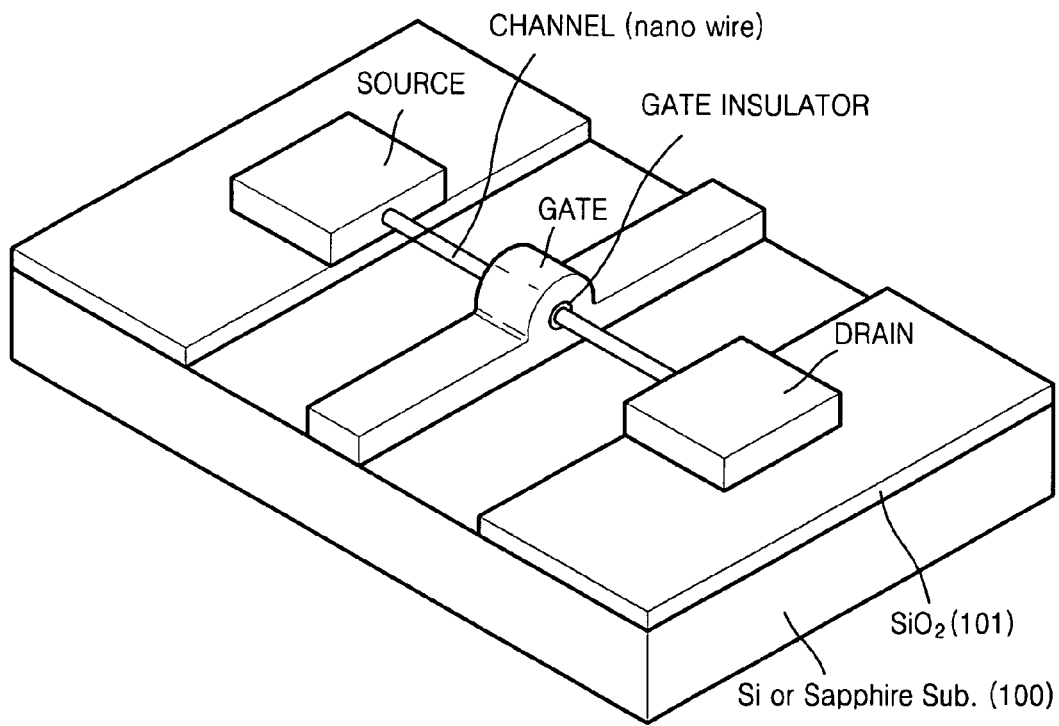

FIGS. 3A and 3B illustrate a structure of a nanowire transistor in an initial stage in which a gate may be formed in a half-finished product obtained by the processes of FIG. 2A-2C.

FIG. 3A illustrates a fin transistor in which a plurality of nanowires may be used for channels and a source and a drain may be disposed at both ends of the nanowires. A gate insulation layer may be formed on the surface of the nanowires forming the channels using thermal oxidation, and a gate may be disposed on the gate insulation layer in a direction crossing the channel. In processes of fabricating the fin transistor, a product obtained by the above-described processes, for example, the half-finished product illustrated in FIG. 2C, may be polished using CMP and/or the like to control the heights of the source and the drain. Undesired portions, e.g., alumina and/or the like, generated from the previous process, may be removed using selective etching. The gate insulation layer may be formed on the surface of the nanowires using thermal oxidation, and, a gate may be formed on the nanowires using photolithography.

FIG. 3B illustrates a coaxial gate transistor in which a single nanowire forms channels, and the nanowire may be coved by gate insulation material and/or a gate. In processes of fabricating the coaxial gate transistor, a product obtained by the above-described processes, for example, the half-finished product illustrated in FIG. 2C, may be polished using CMP and/or the like to control the heights of the source and the drain. Undesired portions, e.g., all nanowires excluding one, alumina, and/or the like, generated in the previous process, may be removed using selective etching. The gate insulation layer may be formed on the surface of the nanowires using thermal oxidation, and a gate may be formed on the nanowires using photolithography.

The transistors in FIG. 3A and 3B may be partially exaggerated for convenience of explanation. FIGS. 3A and 3B illustrate examples of the transistors that may be fabricated using a method according to the example embodiments of the present invention. Meanwhile, the gate insulation layer may be formed using thermal oxidation. However, according to another example embodiment of the present invention, the gate insulation layer may be formed of additional ferroelectric materials. Furthermore, according to still another example embodiment of the present invention, the gate insulation layer may be formed of oxides formed using thermal oxidation, and ferroelectric materials may be additionally deposited.

According to an example embodiment of the present invention, higher quality nanowires, whose orientation may be controlled and are made of crystalline materials, e.g., Si, SiGe, and/or the like, may be formed parallel to a substrate. In addition, a higher quality transistor may be formed on a substrate by applying a method of fabricating the nanowires.

A method of fabricating nanowires, according to an example embodiment of the present invention, may be used to fabricate multi-layer nanowires and may be employed to fabricate a multi-layer transistor.

The foregoing is illustrative of example embodiments of the present invention and is not to be construed as limiting thereof. Although a few example embodiments of the present invention have been described, those skilled in the art will readily appreciate that many modifications may be possible in the example embodiments without materially departing from the novel teachings and advantages of example embodiments of the present invention. Accordingly, all such modifications are intended to be included within the scope of example embodiments of the present invention as defined in the claims. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed, and that modifications to the disclosed embodiments, as well as other embodiments, are intended to be included within the scope of the appended claims. Example embodiments of the present invention are defined by the following claims, with equivalents of the claims to be included therein.

What is claimed is:

1. A method of fabricating a crystalline wire, comprising:
    forming a template layer on a substrate, the template layer having a first lateral surface and a second lateral surface facing the first surface;
    forming pores in the template layer, the pores being disposed between the first lateral surface and the second lateral surface in the template layer and having first apertures in the first lateral surface;
    forming a single-crystalline material layer contacting the first apertures disposed on the first lateral surface of the template layer;
    forming second apertures in the second lateral surface;
    connecting the pores in the template layer;
    supplying gaseous crystal growth materials through the second apertures; and
    forming crystalline nanowires in the pores by crystal growth from the single-crystalline material layer.

2. The method of claim 1, wherein the template layer is formed on a buffer layer formed on the substrate.

3. The method of claim 2, wherein the buffer layer is made of $SiO_2$.

4. The method of claim 1, wherein the crystalline nanowires are formed of one of the group including Si and SiGe.

5. The method of claim 1, wherein the substrate is formed of one of the group including Si and SiGe.

6. The method of claim 1, the forming of the template layer, further comprising:
    forming the template layer of aluminum; and
    forming the pores in the template layer parallel to the substrate by anodic oxidation.

7. The method of claim 5, forming the template layer, further comprising:
    forming the template layer of aluminum; and
    forming the pores in the template layer and parallel to the substrate by anodic oxidation.

8. The method of claim 6, further comprising:
    forming a capping layer on the template layer except for the first lateral surface and the second lateral surface before forming the pores.

9. The method of claim 7, further comprising:
    forming a capping layer on the template layer except for the first lateral surface and the second lateral surface before forming the pores.

10. The method of claim 1, wherein the substrate is one of a Si and sapphire substrate and a buffer layer is formed thereon.

11. The method of claim 10, wherein forming the single-crystalline material layer includes:
    forming a window in a portion near the first apertures of the buffer layer, the window exposing the surface of the substrate; and epitaxially growing the single-crystalline material from the surface of the substrate exposed through the window to contact the apertures.

12. The method of claim 10, wherein forming the single-crystalline material layer includes:
   forming a window in a portion near the first apertures of the buffer layer, the 1window exposing the surface of the substrate;
   epitaxially growing the single-crystalline material from the surface of the substrate exposed through the window;
   forming amorphous silicon on a stacked structure having the first lateral surface of the template layer; and
   inducing crystallization of the amorphous silicon from the contact portion to the single-crystalline material by annealing or selective crystal growth using laser beams, and then transforming the amorphous silicon contacting the apertures into single-crystalline silicon.

13. The method of claim 10, wherein forming the single-crystalline material layer includes:
   forming a window in a portion near the first apertures of the buffer layer, the window exposing the surface of the substrate;
   epitaxially growing the single-crystalline material from the surface of the substrate exposed through the window;
   forming amorphous silicon on a stacked structure having the first lateral surface of the template layer; and
   inducing crystallization of the amorphous silicon from the contact portion to the single-crystalline material by annealing, and then transforming the amorphous silicon contacting the apertures to single-crystalline silicon.

14. The method of claim 13, wherein the single-crystalline material is epitaxially grown using a selective epitaxial growth method.

15. The method of claim 14, wherein the single-crystalline material is epitaxially grown using ultra high voltage (UHV) CVD or low pressure (LP) CVD.

16. The method of claim 14, wherein a growing material may be one of the group including Si and SiGe.

17. The method of claim 13, wherein the amorphous silicon may be deposited to a given thickness on the substrate using LPCVD.

18. The method of claim 1, wherein the single-crystalline nanowires grow from the single-crystalline seed layer exposed by the pores through which a source gas passes.

19. A method of fabricating a transistor with the nanowires according to claim 1, the method further comprising:
   forming the crystalline nanowires as channels; and
   forming a gate to form an electric field toward the crystalline nanowires and a source and drain, respectively, electrically connected to ends of the wires.

* * * * *